United States Patent
Shone

(10) Patent No.: US 7,163,863 B2
(45) Date of Patent: Jan. 16, 2007

(54) VERTICAL MEMORY CELL AND MANUFACTURING METHOD THEREOF

(75) Inventor: Fuja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 0 days.

(21) Appl. No.: 10/878,016

(22) Filed: Jun. 29, 2004

(65) Prior Publication Data

US 2005/0285177 A1 Dec. 29, 2005

(51) Int. Cl.
*H01L 21/336* (2006.01)
(52) U.S. Cl. .................. 438/259; 438/283
(58) Field of Classification Search ........... 438/259, 438/283; 257/365, 366
See application file for complete search history.

(56) References Cited

U.S. PATENT DOCUMENTS

| | | | |
|---|---|---|---|
| 5,386,132 A | 1/1995 | Wong | |
| 5,739,567 A | 4/1998 | Wong | |
| 6,087,222 A * | 7/2000 | Jung Lin et al. | 438/259 |
| 6,391,719 B1 * | 5/2002 | Lin et al. | 438/259 |
| 6,465,836 B1 * | 10/2002 | Lin et al. | 257/315 |
| 6,583,466 B1 * | 6/2003 | Lin et al. | 257/314 |
| 6,979,857 B1 * | 12/2005 | Forbes | 257/314 |
| 2005/0001258 A1 * | 1/2005 | Forbes | 257/314 |
| 2005/0259467 A1 * | 11/2005 | Forbes | 365/185.06 |
| 2005/0276117 A1 * | 12/2005 | Forbes | 365/185.28 |

* cited by examiner

*Primary Examiner*—Ngan V. Ngo
(74) *Attorney, Agent, or Firm*—Oliff & Berridge, PLC

(57) ABSTRACT

A vertical split gate memory cell of silicon-oxide-nitride-oxide-silicon (SONOS) type formed in a trench of a semiconductor substrate includes a first doping region, a second doping region, a conductive line, a conductive plug, a first insulating layer and a second insulating layer, wherein the conductive line and conductive plug serve as a select gate and a control gate of the vertical split gate memory cell, respectively. The first doping region of a first conductive type is underneath the bottom of the trench, whereas the second doping region of the first conductive type is beside the top of the trench. The conductive line serving as the select gate is formed in the bottom of the trench and in operation relation to the first doping region. The first insulating layer is between the conductive line and the first doping region for insulation. The conductive plug is formed above the conductive line, and insulated from the conductive line by the second insulating layer. As to the formation of isolating plugs, for example, composed of CVD oxide, between memory cells, it can be done by etching conductive lines into holes and filling up the holes with CVD oxide or by filling the trenches with oxide between memory cells first.

8 Claims, 18 Drawing Sheets

VERTICAL MEMORY CELL AND MANUFACTURING METHOD THEREOF

BACKGROUND OF THE INVENTION (A) Field of the Invention

The present invention is related to a non-volatile memory cell and the manufacturing method thereof, and more particularly to a vertical memory cell and the manufacturing method thereof.

(B) Description of the Related Art

With the development of high degree integration on a substrate, scaling down a non-volatile memory cell is rather hindered due to inherent dimensions of source, drain and gate channel thereof, so the roadmap of high density non-volatile memories may slow down significantly. Accordingly, the development of small memory cells is crucial for the next generation, and thus vertical memory cells have been attracting much attention recently.

Wong et al. disclosed a non-volatile memory cell of vertical floating gates in U.S. Pat. No. 5,739,567. FIG. 1 shows a vertical memory cell 500 disclosed by Wong et al., where channel regions 503 are formed on the top of a source region 502, and drain regions 504 are formed on the top of the channel regions 503. Floating gates 505 are formed on the sidewalls 506 of a trench 507. A gate dielectric film 508 is formed between the floating gate 505 and the source region 502, the drain region 504 as well as the channel region 503. A control gate 509 formed adjacent to the floating gate 505 in the trench 507 covers the floating gate 505. The control gate 509 is insulated from the floating gate 505 and the source region 502 by a layer of dielectric film 510. The cell 500 is programmed by conventional hot electron injection and is erased by electron tunneling from the floating gates 505 to either the source region 502 or the drain regions 504. The drain regions 504 and source region 502 are at different heights, and the gate dielectric films 508 are located vertically. Obviously, the gate channels do not occupy any space in the horizontal direction, so a high degree integration can be obtained.

Further, a conventional non-volatile memory cell normally needs high current to operate, e.g., 200 microamperes (µA), for hot electron programming, so it is not satisfactory for low power devices that comply with the tendency for chip development. Therefore, a split gate technology has been developed to obtain the high efficiency and low current programming, where the programming current can be diminished to, for example, 10 µA. In view of the consideration of a high degree integration and low power, the skill to integrate the vertical cell and split gate has come into existence.

For the concern of high power consumption during hot electron programming, as shown in FIG. 2, Wong et al. further disclosed a split gate architecture 900 in U.S. Pat. No. 5,386,132 to achieve the capability of low current programming. There are two transistors formed in series, where a transistor 921 is formed in a trench 907 and a transistor 922 is formed in another trench 920. In comparison with the conventional vertical memory cell 500 as shown in FIG. 1, the transistor 922 is integrated into the split gate cell structure by adding another trench 920 adjacent to the trench 907. The transistor 921 is the floating gate transistor with a channel length 912 determined by the edge of the drain 904 and the bottom of the trench 914 and with the channel width determined by the perimeter of the trench 907. A control gate 909 is insulated from a floating gate 905 and a channel region 903 by oxide layers 910 and 924, respectively, and gate dielectric films 908 are located vertically. The transistor 922 is the series select transistor with a channel length 923 determined by the distance between the bottom of trench 914 and source region 902, and with the channel width determined by the perimeter of the second trench 920. Accordingly, a second deep trench is formed to modulate a second portion of the channel and form a series transistor, which in fact leads to a rather complex process.

As shown in FIG. 3, Lin et al. disclosed a split gate memory cell of another type in U.S. Pat. No. 6,087,222. A memory device 100 is established in trenches of a substrate 101, in which the source region S and drain regions D are formed at different heights, and a tunnel oxide 102, a polysilicon layer 108, an oxide-nitride-oxide (ONO) layer 103 and another polysilicon layer 105 are sequentially formed. In addition, spacers 104 are formed beside the polysilicon layers 105. The polysilicon layers 108 and 105 act as a floating gate and a control gate, respectively. As a result, there are a series of transistors between the source region S and the drain region D. The control gate, i.e., the polysilicon gate 105, is operative to couple a voltage to the floating gate 108 in the light of a coupling ratio, and further acts as a split gate. However, the split gate voltage is not operated independently, despite the fact that the control gate voltage can turn on the floating gate and split gate transistors effectively, and electrons may jump into the floating gate as well as the control gate owing to high bias voltages generated both in the floating gate and in the control gate. Accordingly, although this approach may reduce process complexity, electron injection efficiency during programming may not be optimized. Since gate voltage of the select transistors is always coupled from control gate and cannot be independently adjusted, low programming efficiency or electrons trapped in the ONO layers may be created instead. Thus, it is necessary to develop a split gate vertical memory transistor with simple process and high programming efficiency.

SUMMARY OF THE INVENTIION

The objective of the present invention is to provide a vertical split gate memory cell for low power device applications and high degree integration. In addition, the vertical split gate memory cell can be more easily manufactured, so the cost is lowered.

To achieve the above objective, a vertical split gate memory cell of silicon-oxide-nitride-oxide-silicon (SONOS) type has been developed. The vertical split gate memory cell formed in a trench of a semiconductor substrate comprises a first doping region, a second doping region, a conductive line, a conductive plug, a first insulating layer and a second insulating layer, wherein the conductive line and conductive plug serve as a select gate and a control gate of the vertical split gate memory cell, respectively. The first doping region of a first conductive type is underneath the bottom of the trench, whereas the second doping region of the first conductive type is beside the top of the trench. The conductive line serving as the select gate is formed in the bottom of the trench and in operation relation to the first doping region. The first insulating layer is between the conductive line and the first doping region for insulation. The conductive plug is formed above the conductive line, and insulated from the conductive line by the second insulating layer.

For instance, the above vertical split gate memory cell can be manufactured by the following process. First, a semiconductor substrate having at least one trench is provided.

Second, dopants are implanted into the semiconductor substrate to form the first doping region and the second doping region at different heights. Then, the first insulating layer is formed on the first doping region by, for example, thermal growth, and a gate dielectric layer, e.g., an ONO layer, is deposited along the trench thereafter. A conductive layer is deposited to fill the trench, and etched back to form the conductive line at the bottom of the trench. Sequentially, a second insulating layer, e.g., a silicon oxide layer, is formed on the conductive line and followed by forming the conductive plug thereon. Actually, various manufacturing methods can also be employed for the formation of the vertical split gate memory cell, and they will be described in detail in the following embodiments.

DETAILED DESCRIPTION OF THE INVENTION

Embodiments of the present invention are now being described with reference to the accompanying drawings.

A process for making a vertical split gate memory cell of NMOS type is exemplified as follows, with a view to illustrating the features of the present invention.

Figure 1:
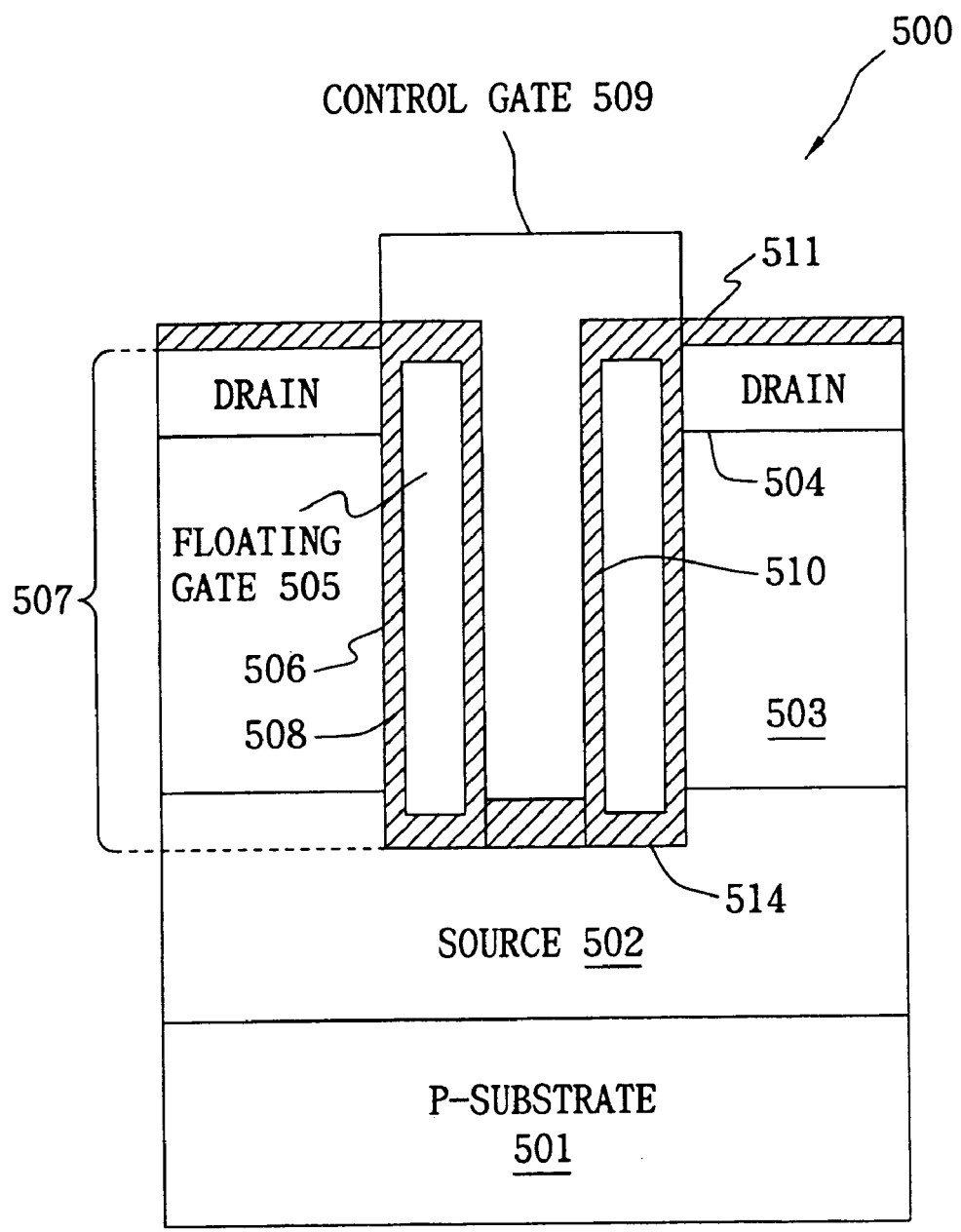
FIG. 1 illustrates a known vertical memory cell.
Figure 2:
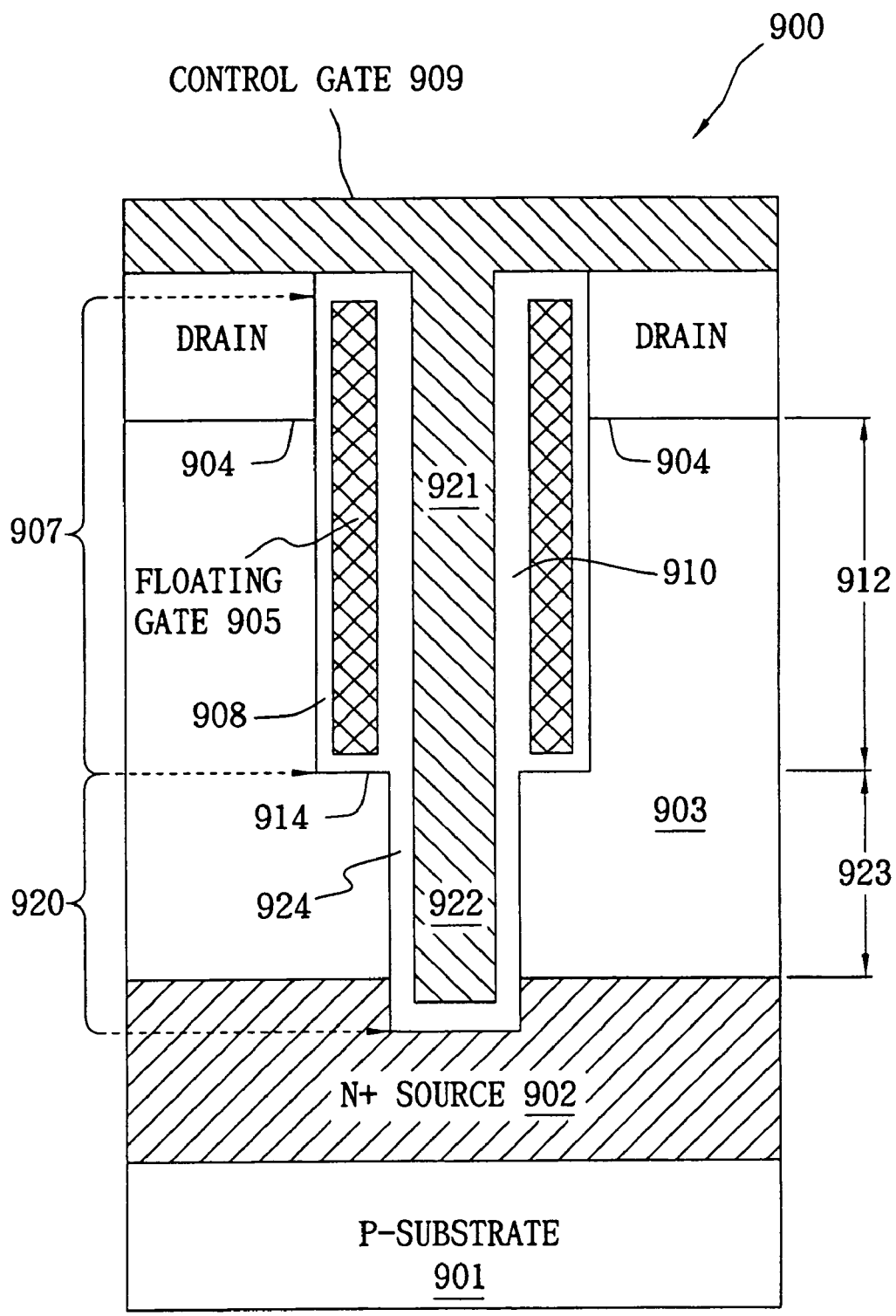
FIG. 2 illustrates a known vertical split gate memory cell.
Figure 3:
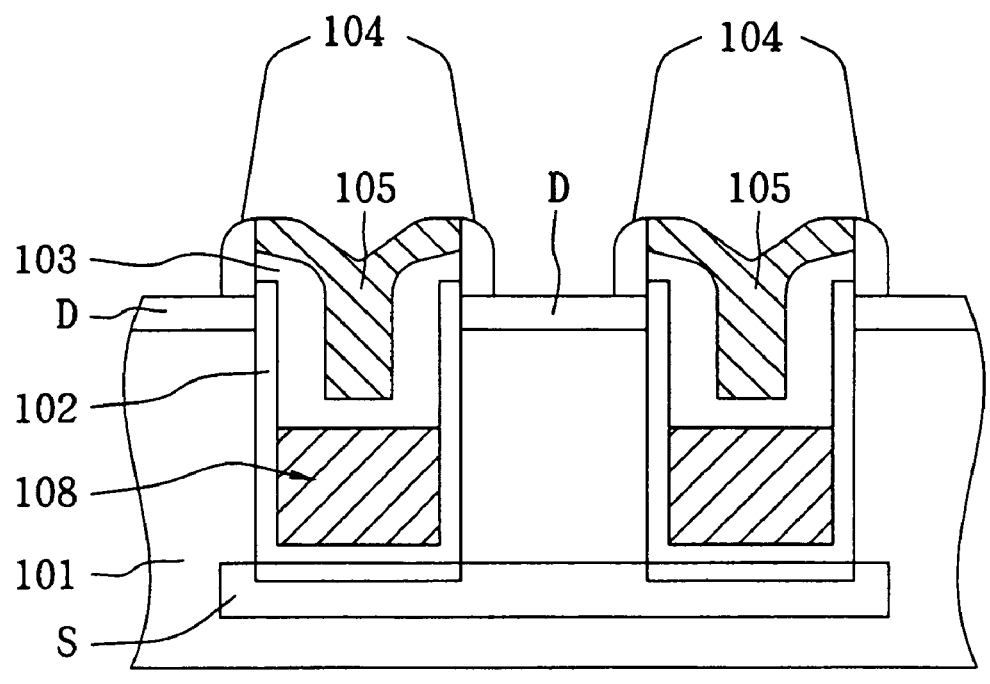
FIG. 3 illustrates another known vertical split gate memory cell.
Figure 4:
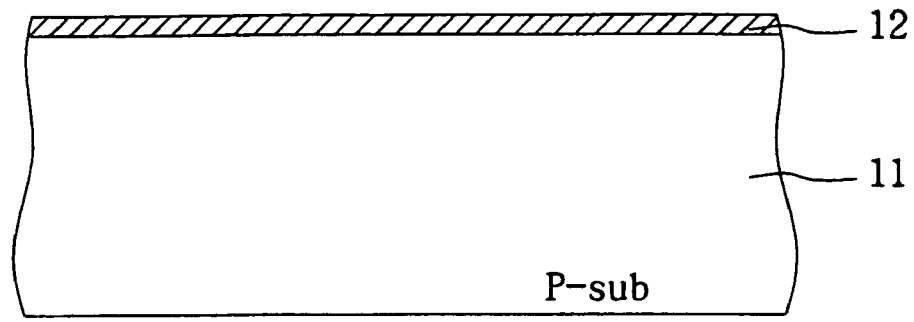
FIGS. 4 through 16 illustrate a manufacturing process of vertical split gate cells in accordance with the present invention.
Figure 5:
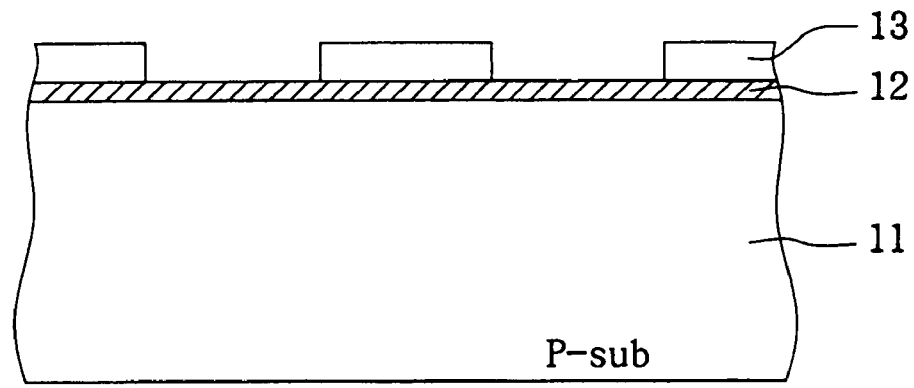

FIGS. 4 through 15 illustrate the memory structures of each step in the manufacturing of a non-volatile vertical split gate memory cell put forth in the present invention. In FIG. 4, a mask layer 12 is formed on a surface of a semiconductor substrate 11, e.g., a silicon substrate, where the mask layer 12 is typically of a thickness between 100–2000 angstroms, and can be composed of silicon nitride (SixNy), silicon oxide (SiOx), silicon oxynitride (SiOxNy) or multi-layer of these films. Then, a photoresist layer 13 is deposited on the surface of the mask layer 12, and is patterned to define multiple trenches as shown in FIG. 5.

Figure 6:
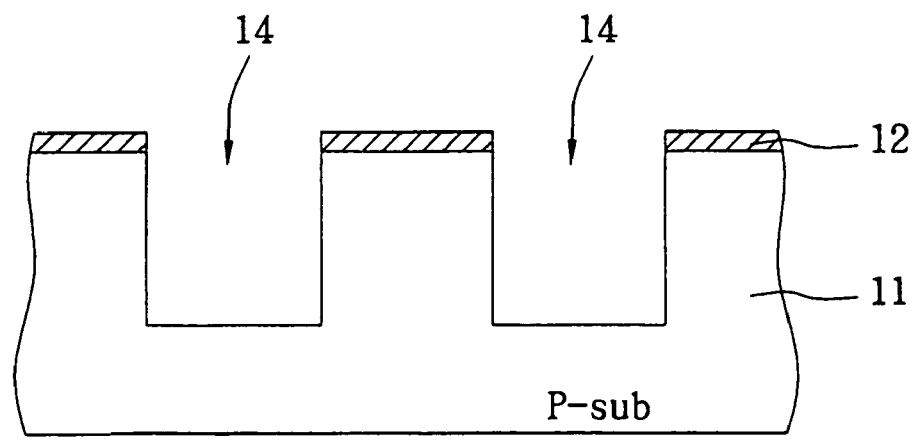

In FIG. 6, the mask layer 12 and the semiconductor substrate 11 are etched based on the patterned photoresist layer 13 to form multiple trenches 14, and the photoresist layer 13 is stripped afterwards. Further, an annealing process at a temperature between 800–1100° C. may be employed to remove the damages caused by etching.

Figure 7:
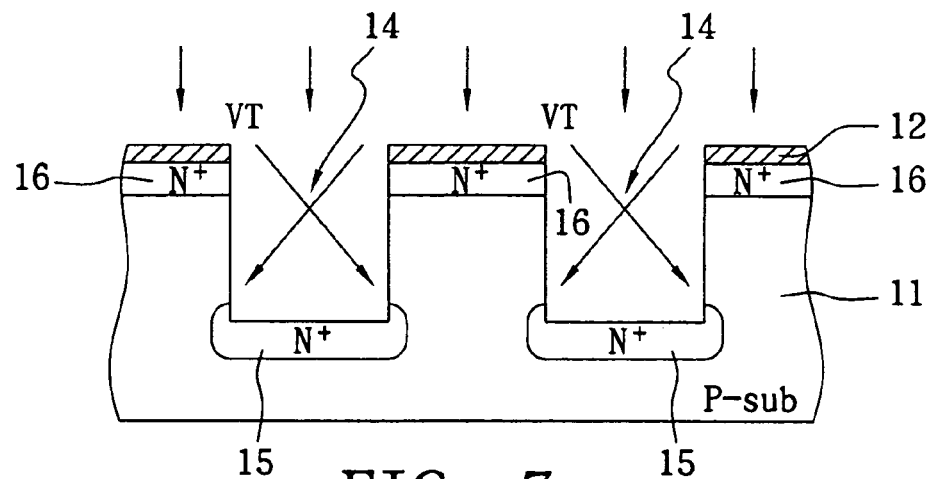

In FIG. 7, N type dopants such as arsenic ions are implanted into the semiconductor substrate 11 with an energy of approximately 80 KeV to form first and second doping regions 15 and 16 of N type at different heights of the semiconductor substrate 11, and the first and second doping regions 15 and 16 serve as source and drain, respectively. The first doping regions 15 are underneath the bottom of the trenches 14, and the second doping regions 16 are beside the top of the trenches 14. In this embodiment, the first and second doping regions 15 and 16 act as bit lines of the memory array. Typically, the doping concentration of the regions 15 and 16 is between $5\times10^{14}$ and $5\times10^{15}$ atoms/cm$^2$. Moreover, P type dopants, e.g., boron or $BF_2^+$ ions, are further implanted with a tilted angle into the semiconductor substrate 11, especially into the trench sidewalls, for threshold voltage adjustment. The implantation dose range is between $1\times10^{12}$ and $1\times10^{14}$ atoms/cm$^2$ to achieve required threshold voltages of the split transistors and floating gate memory cells that will be formed later.

Figure 8:
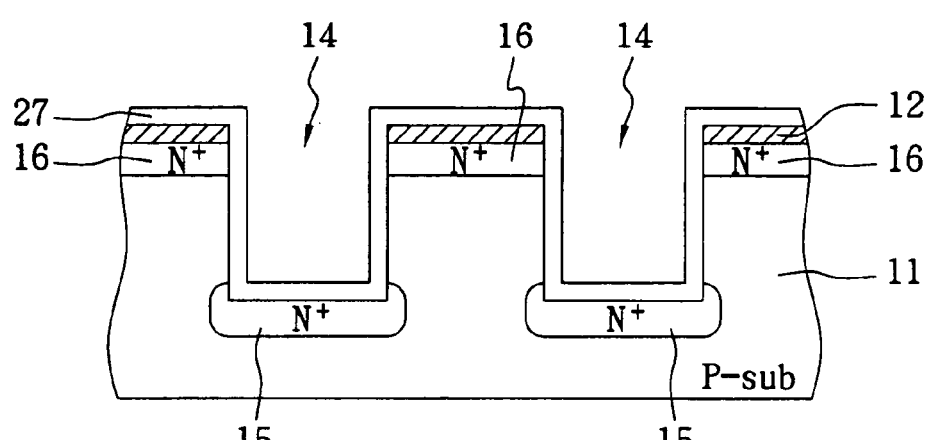
Figure 9:
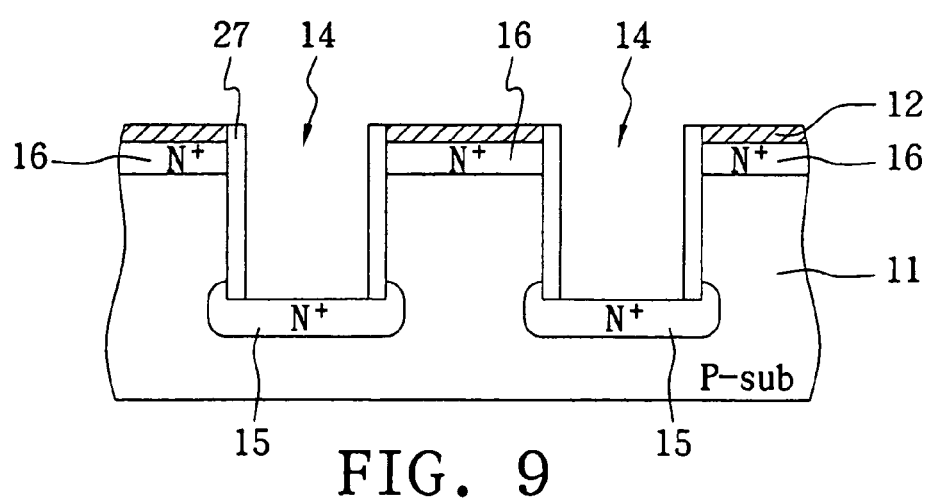
Figure 10:
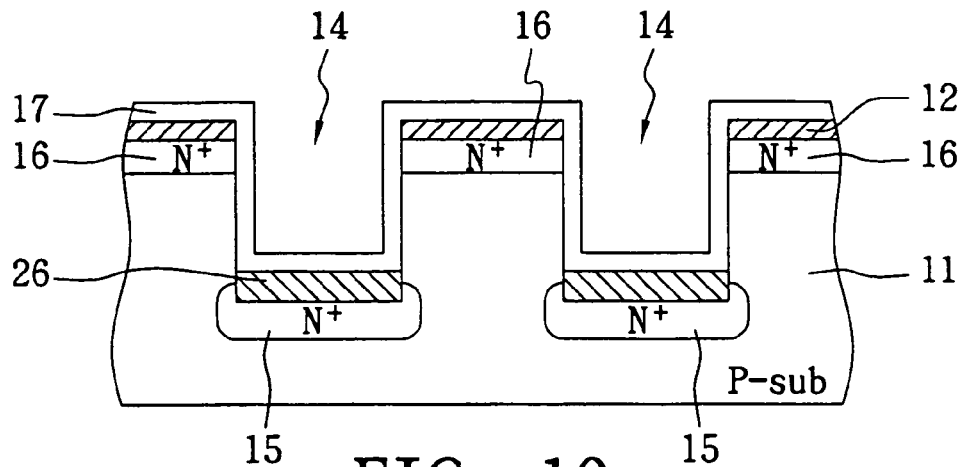

In FIGS. 8 through 10, an oxide/nitride multilayer 27 ranging from 100 to 500 angstroms is formed along the silicon substrate 11 and the sidewalls of the trenches 14, and followed by an etching process to etch the oxide/nitride multilayer 27 on top of the first doping regions 15 away, while the multilayer 27 along the sidewalls of the trenches 14 still remains. Afterwards, an oxidation process is carried out, and there will be only oxides grown on the first doping regions 15 and not along the sidewalls of the trenches 14 so that first insulating layers 26 on the order of 1000 to 3000 angstroms will be formed on top of the first doping regions 15. Sequentially, the oxide/nitride multilayer 27 along the sidewalls is either preserved or etched away, and then a gate dielectric layer, e.g., an oxide-nitride-oxide (ONO) layer 17, is formed on the first insulating layers 26 and the sidewalls of the trenches 14. The thicknesses of the oxide, nitride and oxide layers of the ONO layer 17 are respectively 20–100 angstroms, 20–200 angstroms and 20–200 angstroms from bottom to top as usual, and are typically 50, 60 and 80 angstroms, or 25, 60 and 80 angstroms, depending on different device operating conditions. In other words, the ONO layer 17 having a total thickness between 60–500 angstroms is in wide use. The ONO layer 17 acts as a gate dielectric and a memory storage layer to store more bits in a unit memory cell.

Figure 11:
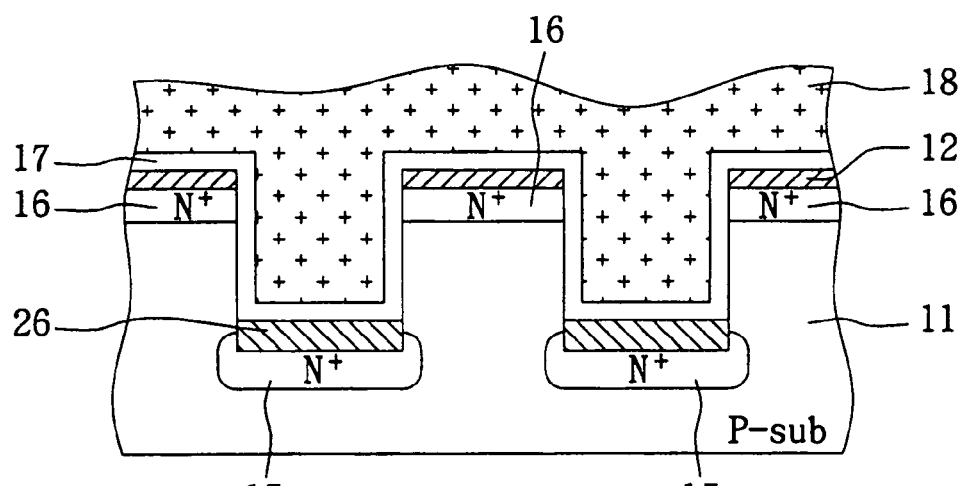
Figure 12:
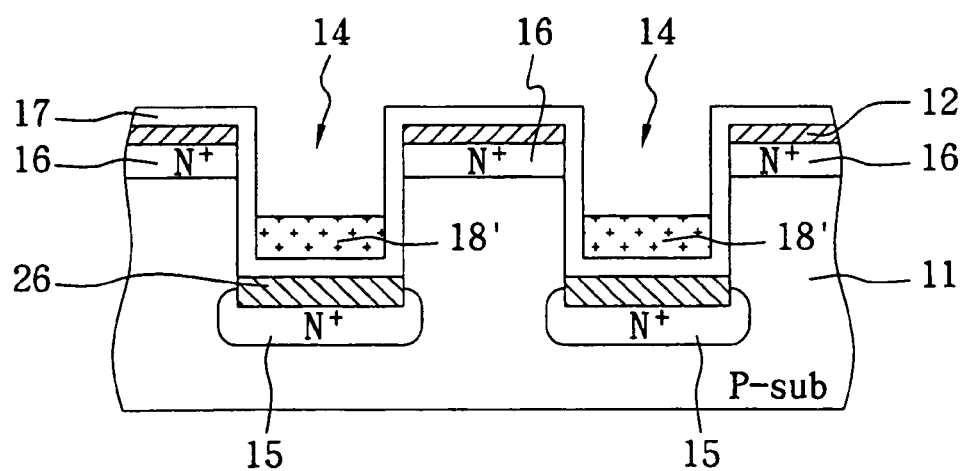

In FIGS. 11 and 12, a conductive layer 18, for example, composed of polysilicon, is deposited by low pressure chemical vapor deposition (LPCVD) to fill up the trenches 14 and followed by being etched back, so as to form first conductive lines 18' partially filled in the trenches 14, i.e., the first conductive lines 18' are formed at the bottoms of the trenches 14. The first conductive lines 18' function as word lines of the select gate transistors, and are substantially parallel to the second doping regions 16.

Figure 13:
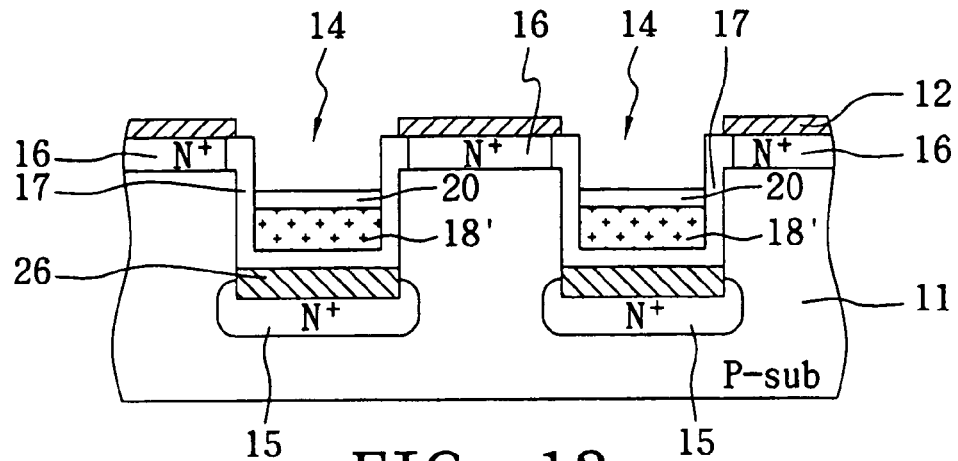

In FIG. 13, second insulating layers 20, e.g., silicon oxide layers, ranging from 500 to 2000 angstroms are formed on the top of the first conductive lines 18' by, for example, thermal growth.

Figure 14:
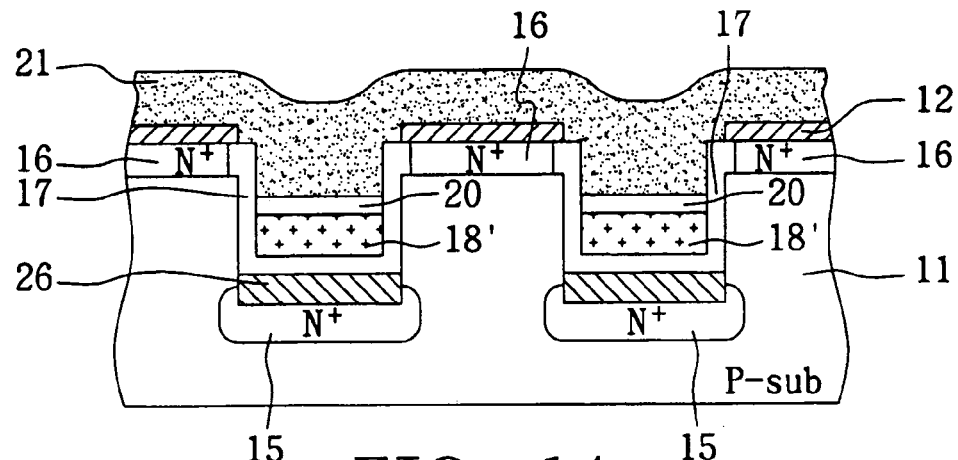
Figure 15:
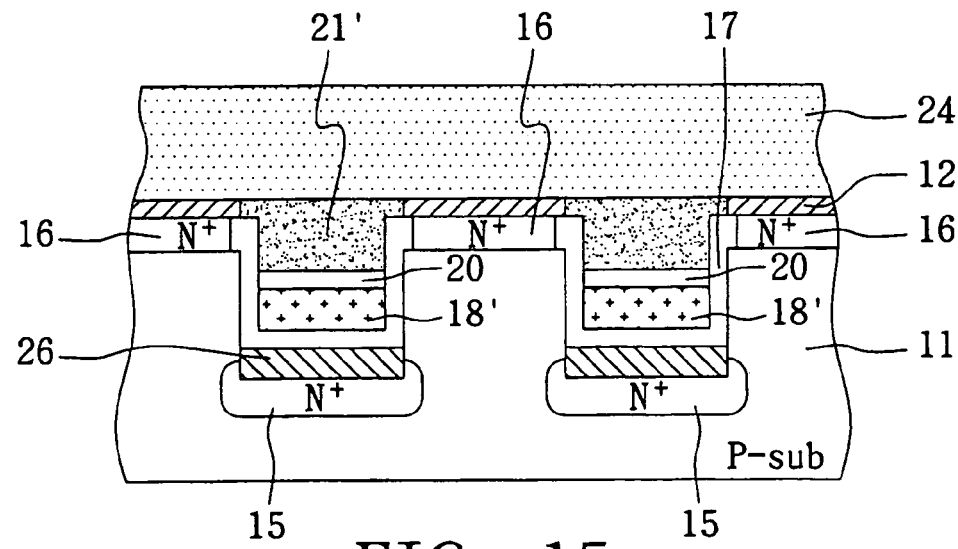

In FIGS. 14 and 15, a conductive layer 21, for example, composed of polysilicon is deposited to fill up the trenches 14, and followed by a planarization process such as chemical mechanical polishing (CMP) to polish off the portion of the conductive layer 21 above the mask layer 12, thereby conductive lines 21' are formed. Then, a conductive layer 24, e.g., a polysilicon or polycide layer, is deposited.

Figure 16:
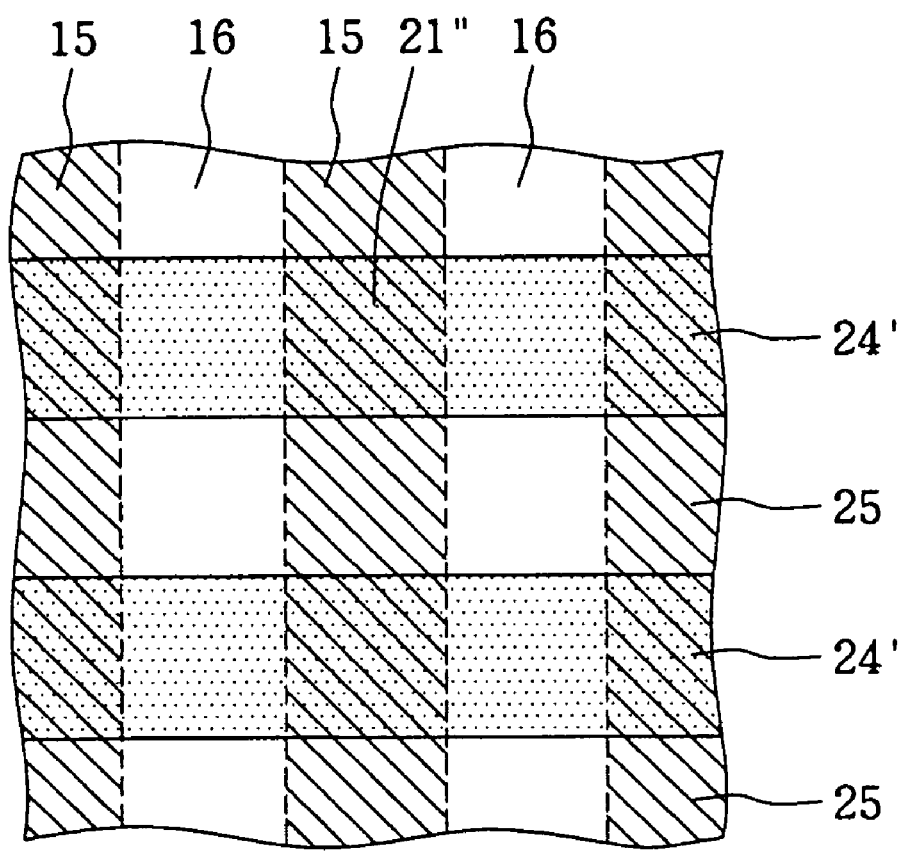

As shown in FIG. 16, depicting the top view of a portion of the memory array, a lithography process and an etching process are performed on the conductive layer 24 and the conductive lines 21', thereby separated second conductive lines 24' are formed as control gate lines which are approximately perpendicular to the first doping regions 15 (source bit lines) and the second doping regions 16 (drain bit lines), and the conductive lines 21' are divided into multiple conductive plugs 21" separated by holes therebetween. Then, an oxide layer 25 is deposited to fill up the holes and the spaces between the second conductive lines 24' by chemical vapor deposition (CVD), and a planarization is formed thereafter by CMP for isolation.

Figure 17:
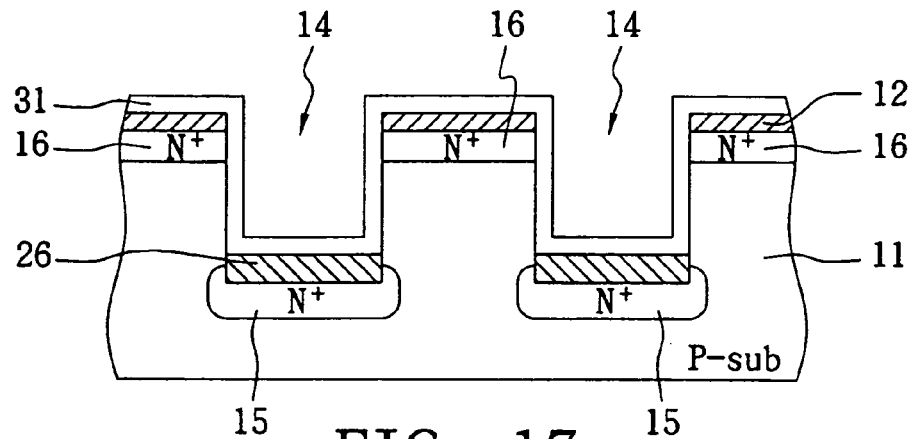
FIGS. 17 through 21 illustrate another manufacturing process for the gate dielectric layer of vertical split gate cells in accordance with the present invention.
Figure 18:
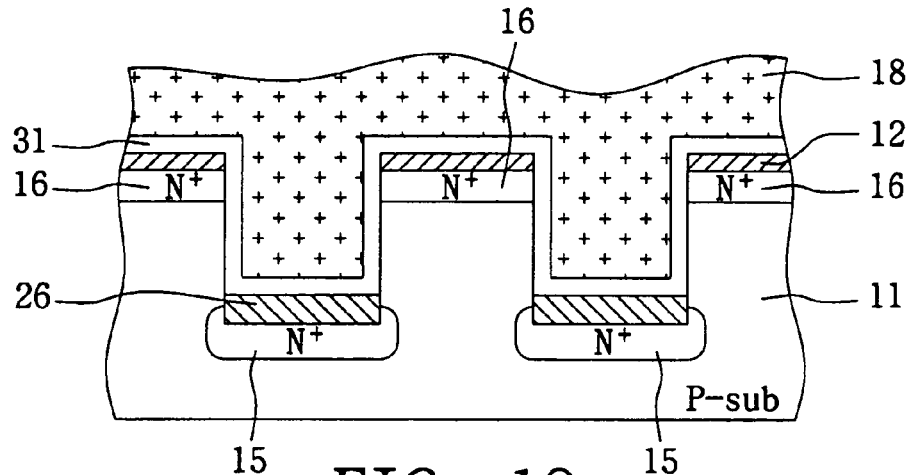
Figure 19:
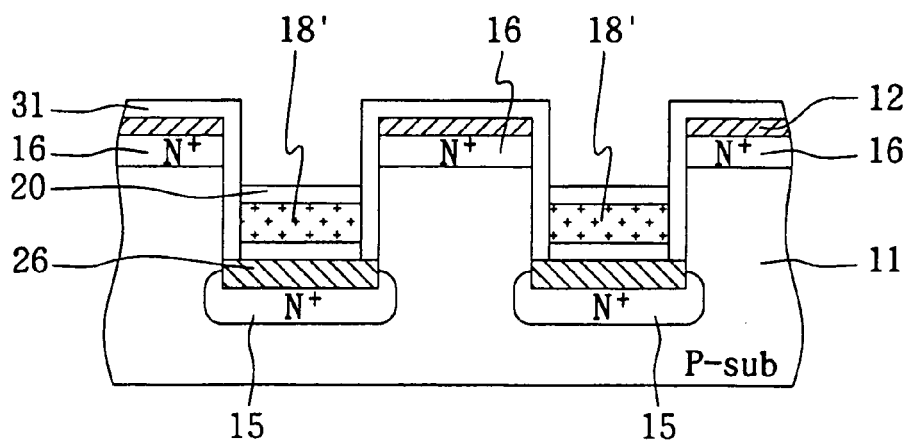
Figure 20:
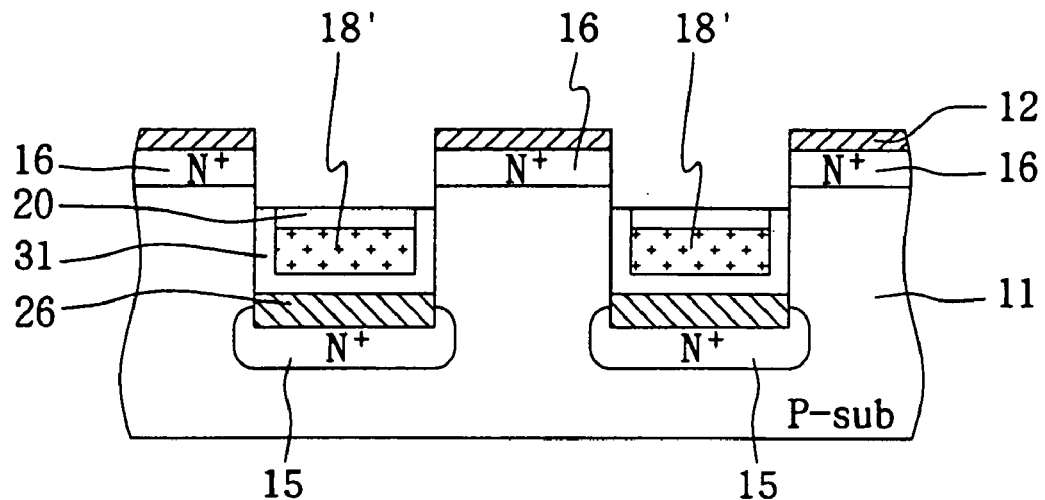
Figure 21:
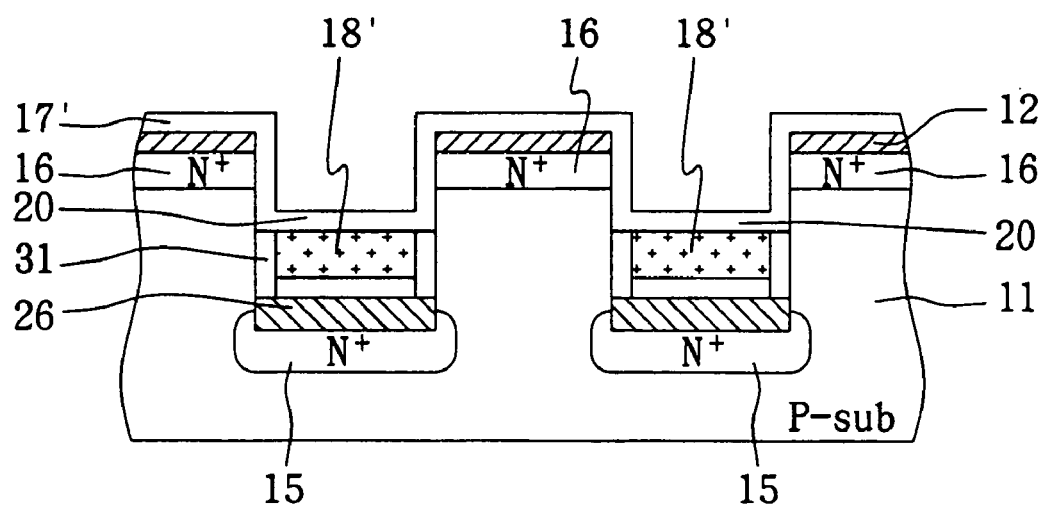

FIGS. 17 through 21 show an alternative process to that of FIGS. 10 through 13. In FIGS. 17 and 18, a silicon oxide layer 31 is formed along the trenches 14, and followed by depositing a conductive layer 18. In FIG. 19, the conductive layer 18 is partially etched to form conductive lines 18', and then an insulating layer 20 may be formed on the top of the conductive lines 18'. In FIG. 20, the exposed silicon oxide layer 31 is stripped away either by dry etching or wet etching. However, the exposed silicon oxide layer 31 may be preserved instead for the case of adequate thickness. In FIG. 21, an ONO layer 17' is formed along the trenched 14, and on the insulating layer 20 or the conductive lines 18'. Accordingly, the ONO layer 17' on the sidewalls of the trenches 14 is associated with the remained silicon oxide layer 31 as a gate dielectric layer, wherein the ONO layer 17' further serves as a storage layer. Starting from here, the sequential process is essentially equivalent to the process as mentioned above, i.e., shown in FIGS. 14 through 16. Alternatively, the materials of the layer 31 and 17' are interchangeable, i.e., the layer 31 can be an ONO layer, and the layer 17' can be a silicon oxide layer.

Figure 22:
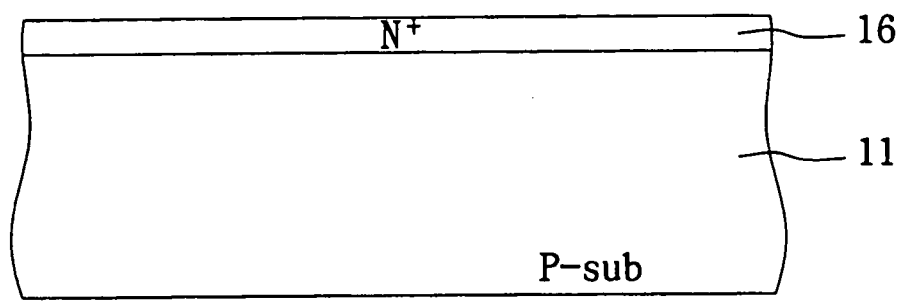
FIGS. 22 through 24 illustrate another method for forming the doping regions of vertical split gate cells in accordance with the present invention.
Figure 23:
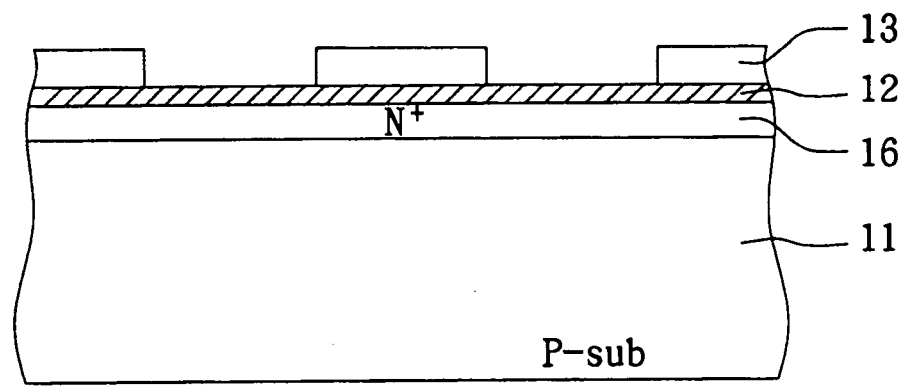
Figure 24:
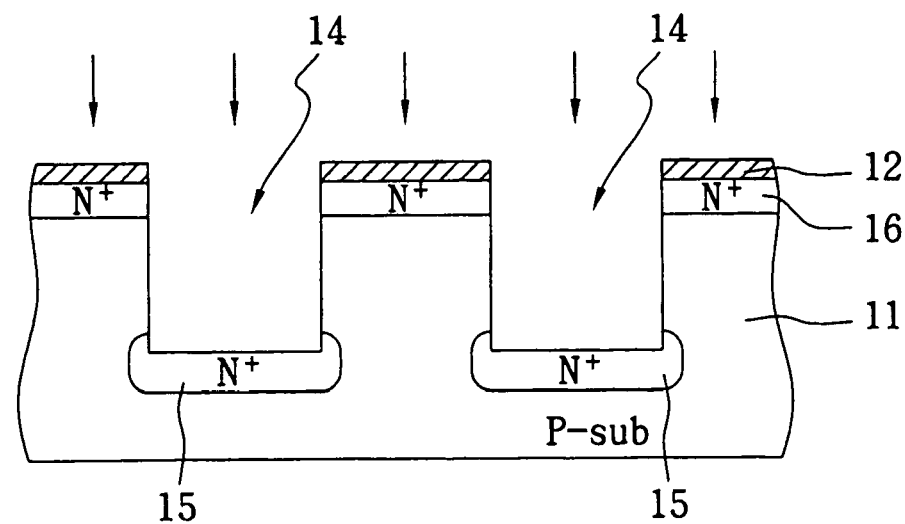

Alternatively, the formation of the doping regions 15, 16 shown in FIGS. 4 through 7 can be also fabricated by another method. As shown in FIGS. 22 through 24, dopants such as arsenic ions are implanted into the substrate 11 with an energy of 50–180 KeV to form the second doping region 16, and then the mask layer 12 and the photoresist layer 13 are sequentially formed on the top of the substrate 11. Afterwards, the trenches 14 are formed by etching, and followed by another implantation to form the first doping regions 15.

Figure 25:
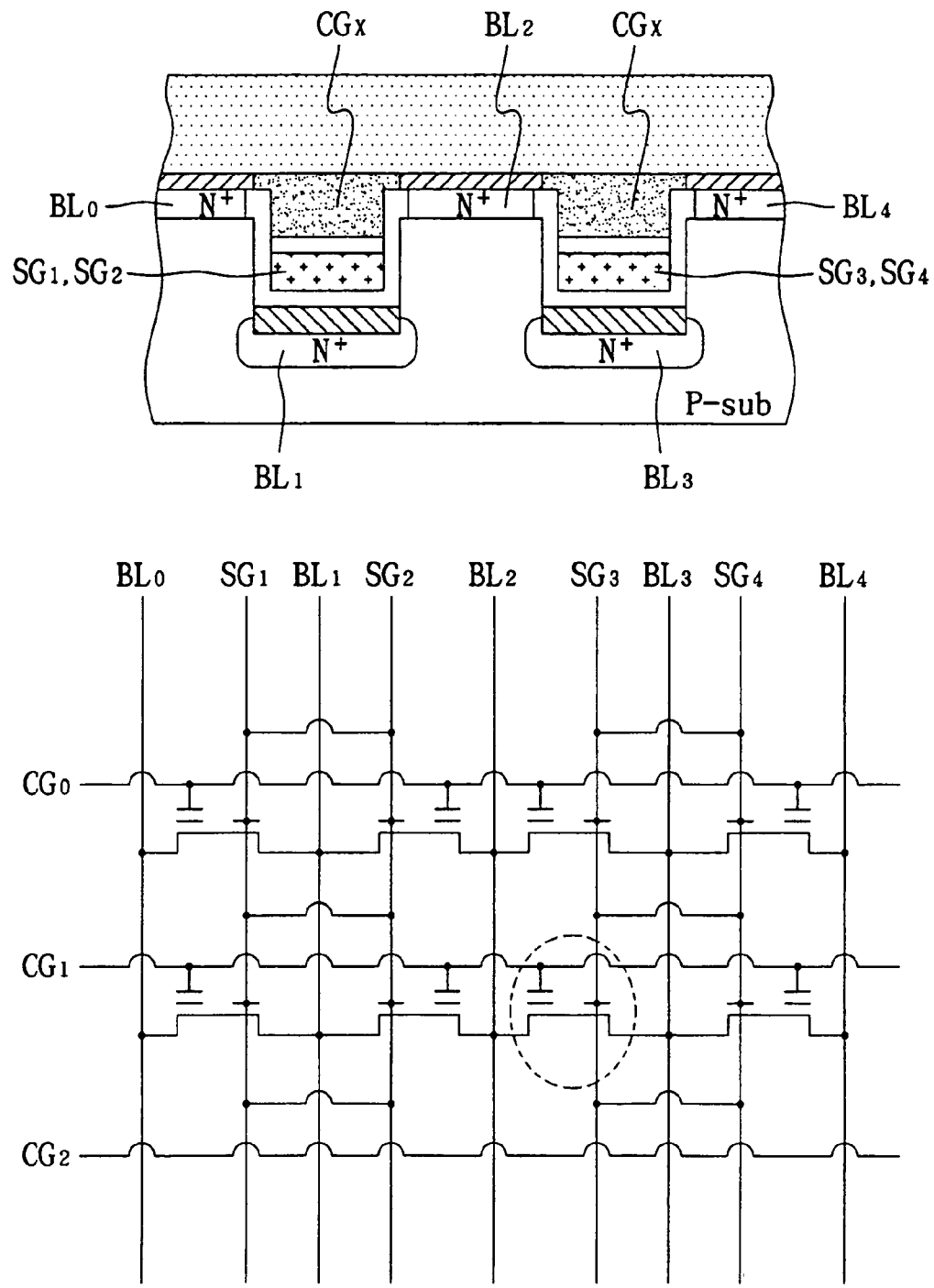
FIG. 25 illustrates a schematic diagram with reference to the vertical split gate cells in accordance with the present invention.

FIG. 25 illustrates a schematic diagram with reference to the vertical split gate memory array put forth in the present invention, in which the memory cell architecture is the same as that shown in FIG. 15 but some components are renamed by their functionality, where a word line is denoted by WL, a bit line is denoted by BL, a select gate is denoted by SG, and a control gate is denoted by CG. The $SG_1$ and $SG_2$, or $SG_3$ and $SG_4$ physically use a common conductive line but control the different adjacent cells individually. Examples for reading, programming and erasing of memory cells $CG_1$, $BL_2$, $BL_3$, i.e., the one with dash line circle in FIG. 25, are shown in Table 1.

TABLE 1

|  | $CG_0$ | $CG_1$ | $CG_2$ | $SG_1$ ($SG_2$) | $SG_3$ ($SG_4$) | $BL_0$ | $BL_1$ | $BL_2$ | $BL_3$ | Sub. | PWI | NWD |
|---|---|---|---|---|---|---|---|---|---|---|---|---|
| Split gate program | 0 V | 8 V | 0 V | 0 V | 1.5 V | 0 V | 0 V | 5 V | 0 V | 0 V | NA | NA |
| Hot electron program | 0 V | 5 V | 0 V | 0 V | 1.5 V | 0 V | 0 V | 5 V | 0 V | 0 V | NA | NA |
| Tunnel erase (I) | 0 V | −12 V | 0 V | 0 V | 0 V | 0 V | 0 V | 0 V | 0 V | 0 V | NA | NA |
| Tunnel erase (II) | 0 V | −8 V | 0 V | 0 V | 0 V | 6 V | 6 V | 6 V | 6 V | 0 V | 6 V | 6 V |
| Hot hole erase | 0 V | −8 V | 0 V | 0 V | 0 V | 0 V | 0 V | 6 V | 0 V | 0 V | NA | NA |
| Read | 0 V | 5 V | 0 V | 0 V | 3 V | 0 V | 0 V | 1.5 V | 0 V | 0 V | NA | NA |

For the condition of erase (II), PWI and NWD represent the technique that p-well and n-well are further formed in the substrate and are applied positive voltages, e.g., +6V for decreasing the control gate voltage. In comparison with the case of erase (I), the $CG_1$ voltage of the erase (II) can be lowered to be roughly from −12V to −8V.

Figure 26:
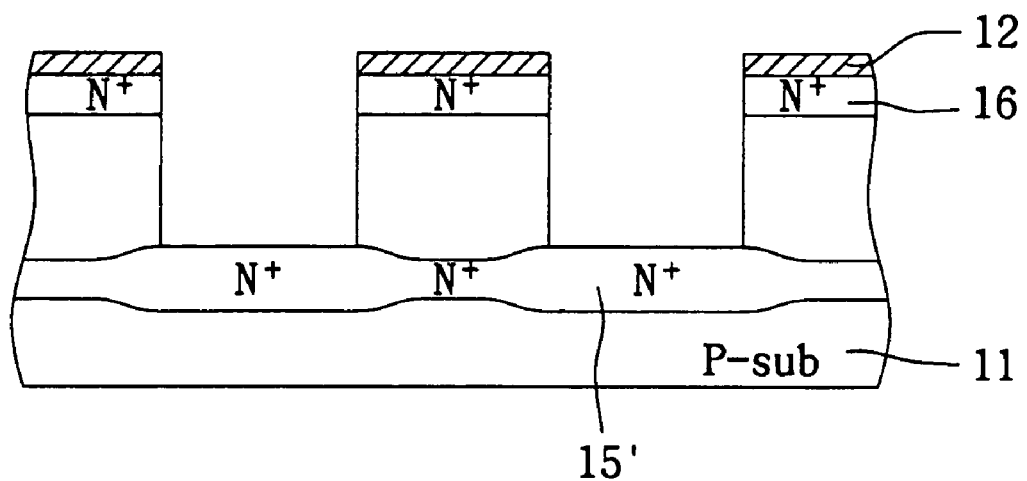
FIG. 26 illustrates a process for manufacturing vertical split gate cells with common sources or drains in accordance with the present invention.
Figure 27:
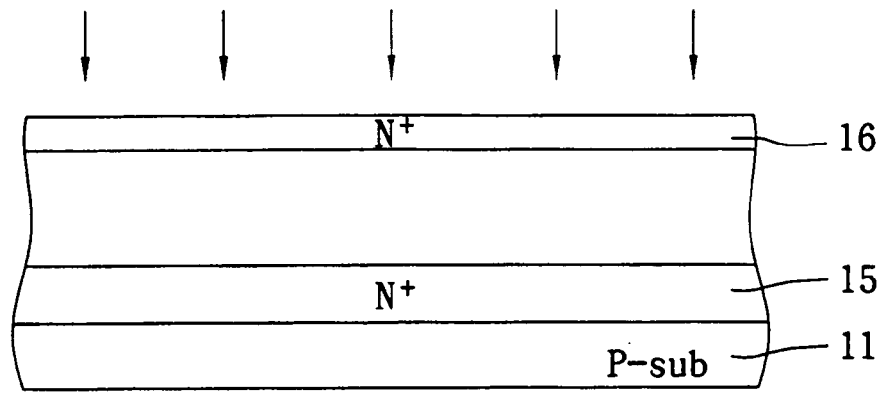
FIGS. 27 through 29 illustrate another method for manufacturing vertical split gate cells with common sources or drains in accordance with the present invention.
Figure 28:
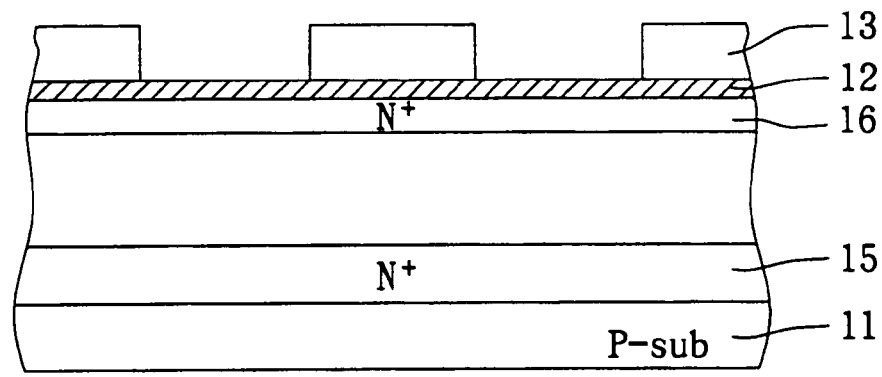
Figure 29:
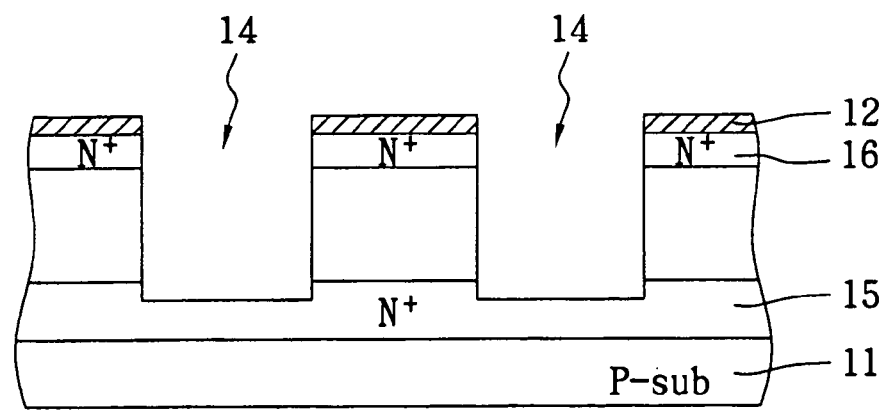

Moreover, the first doping regions 15 of the vertical transistors can be connected as a common bit line, i.e., a common source or drain, so as to decrease the number of contacts to the sources or drains and to isolate vertical transistor's operation from the substrate. As shown in FIG. 26, a thermal process of 700–1100° C. may be further employed before forming the first insulating layer 26 to laterally diffuse the N dopants within the first doping regions 15 for forming a diffusion layer 15' as a common source or drain, thereby the number of contacts connecting to source or drain can be tremendously diminished. Alternatively, the common source or common drain can also be formed by the process as shown in FIGS. 27 through 29. First, dopants are implanted into the substrate 11 at different heights, so as to form the first and second doping regions 15, 16. The second (upper) and first (lower) doping regions 16 and 15 are implanted with different energies and dopants, e.g., 50–180 KeV of arsenic and 500 KeV to 4 MeV of phosphorus, respectively. Then, the mask layer 12 is formed on the top of the substrate 11 and followed by forming and masking the photoresist layer 13. Then, the trenches 14 are formed by etching, and the bottom of the trenches 14 is in contact with the first doping region 15. In addition, the trenches 14 can be etched to approach to the first doping region 15 instead, and followed by thermal diffusion to drive the dopants within the first doping regions 15 upwards, thereby the first doping region 15 can contact the bottom of the trenches 14 as well. After the formation of the first doping region 15, i.e., the common source or drain, the following steps are the same or similar to those shown in FIGS. 8 through 16.

Figure 30:
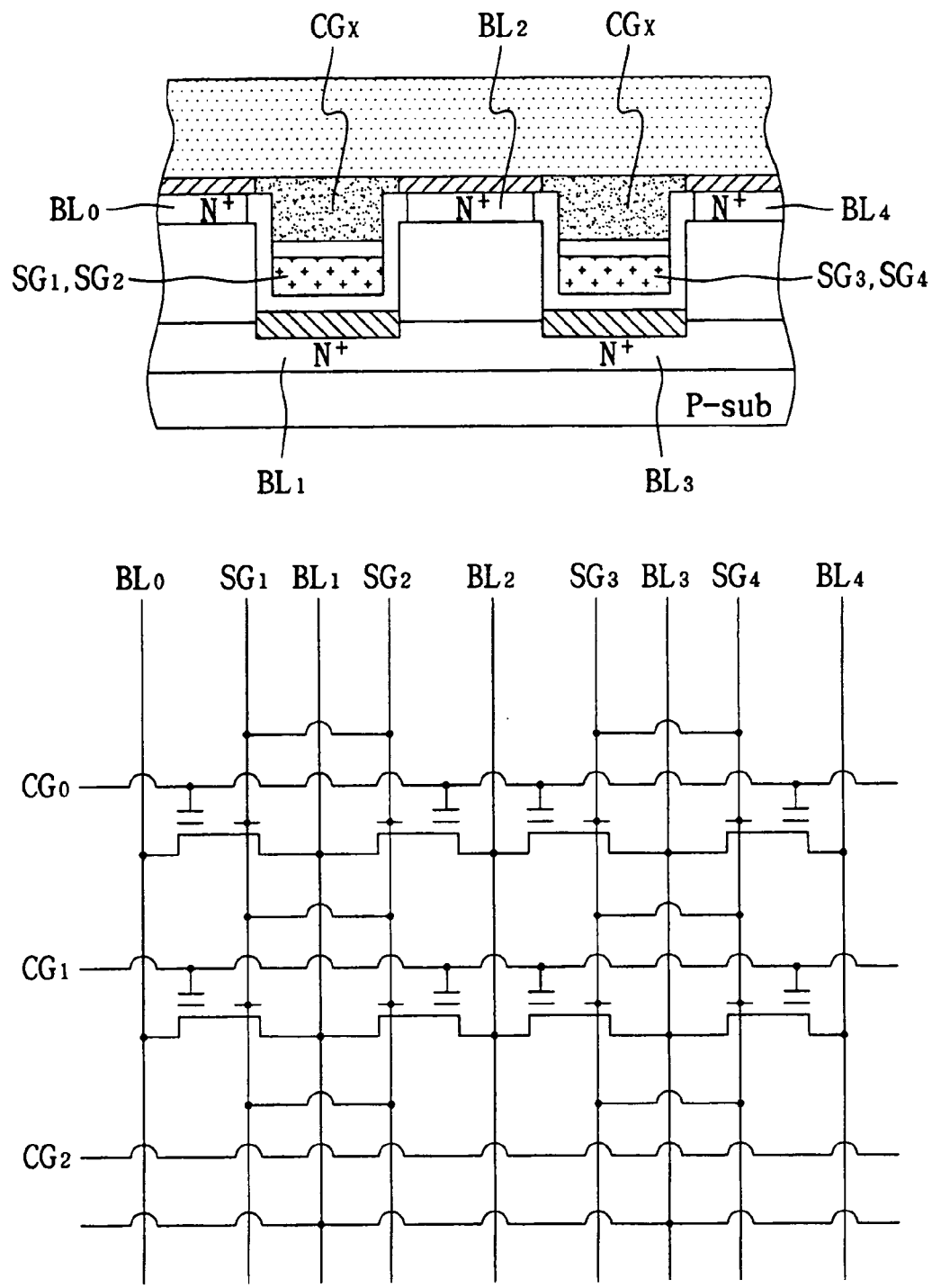
FIG. 30 illustrates a schematic diagram with reference to the vertical split gate cells with common sources or drains in accordance with the present invention.

FIG. 30 illustrates a schematic diagram with reference to the vertical split gate memory array of common sources or drains. In comparison with FIG. 25, the $BL_1$ and $BL_3$ are connected instead.

Instead of the process of etching conductive lines into holes and filling up the holes with CVD oxide as described above, a process of filling the trenches with oxide between memory cells first is described as follows.

Figure 31:
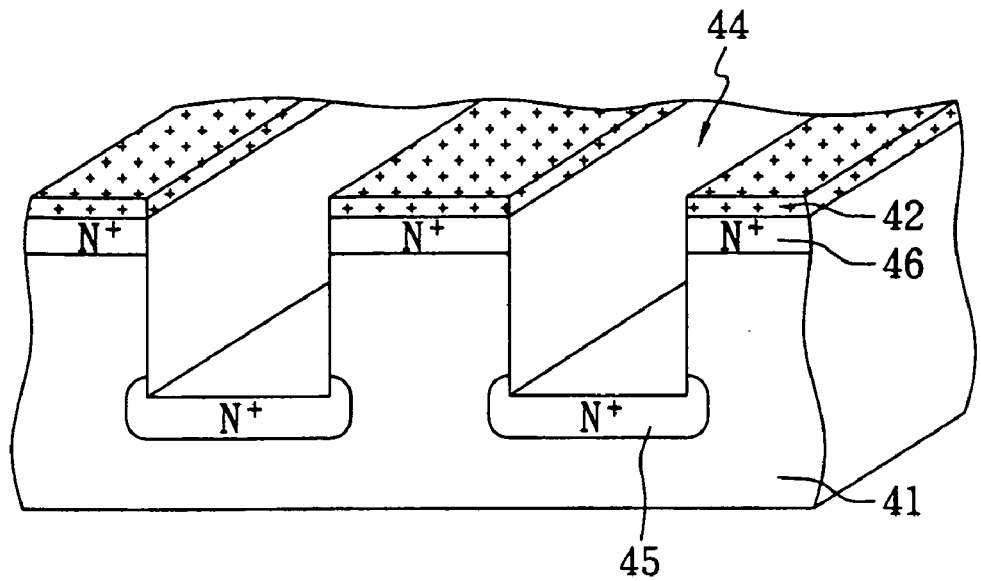
FIGS. 31 through 33 illustrate an alternative method to form isolations between vertical split gate memory cells in accordance with the present invention.
Figure 32:
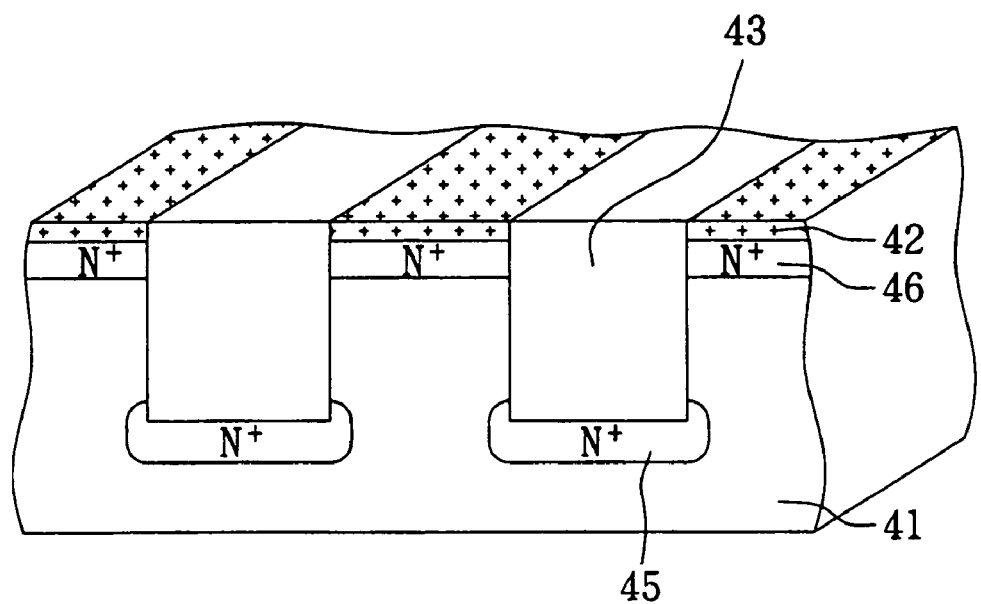
Figure 33:
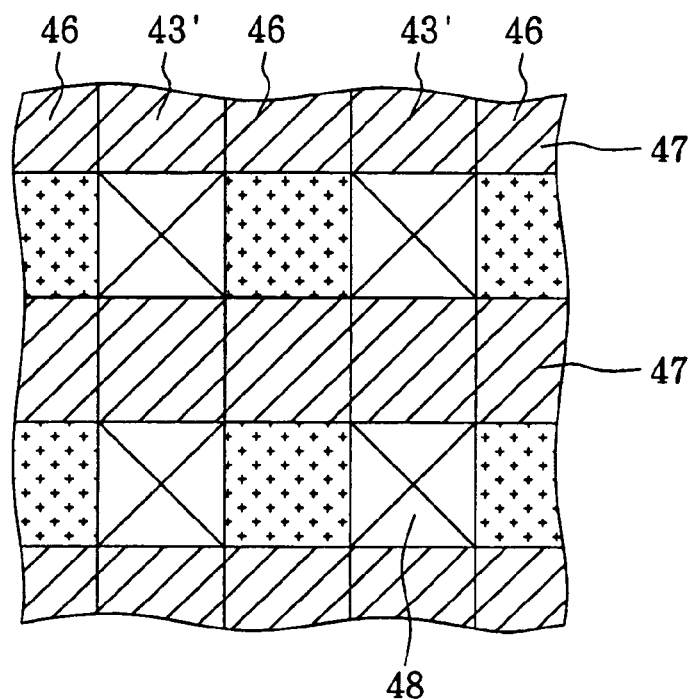

As shown in FIG. 31, a substrate 41 with mask layers 42 is etched to form trenches 44, and followed by implanting $N^+$ dopants so as to form the first and second doping regions 45, 46. In FIG. 32, CVD oxide is deposited to fill up the trenches 44 and followed by a planarization process to form isolating lines 43. As shown in FIG. 33, depicting the top view of the memory array, photoresist lines 47 perpendicular to the second doping regions 46 (bit lines) are formed on the memory array. Then, unprotected isolating lines 43 are etched away to form holes 48 and isolating plugs 43' disposed alternately, thereby active areas of the memory array are formed. Sequentially, the processes mentioned in FIGS. 7 through 15 are performed in the holes 48, i.e., the trenches 14 are deemed as the holes 48, to build up vertical split gate memory cells, wherein the conductive plugs formed in the bottom of the holes 48 are further connected by a conductive line.

Figure 34:
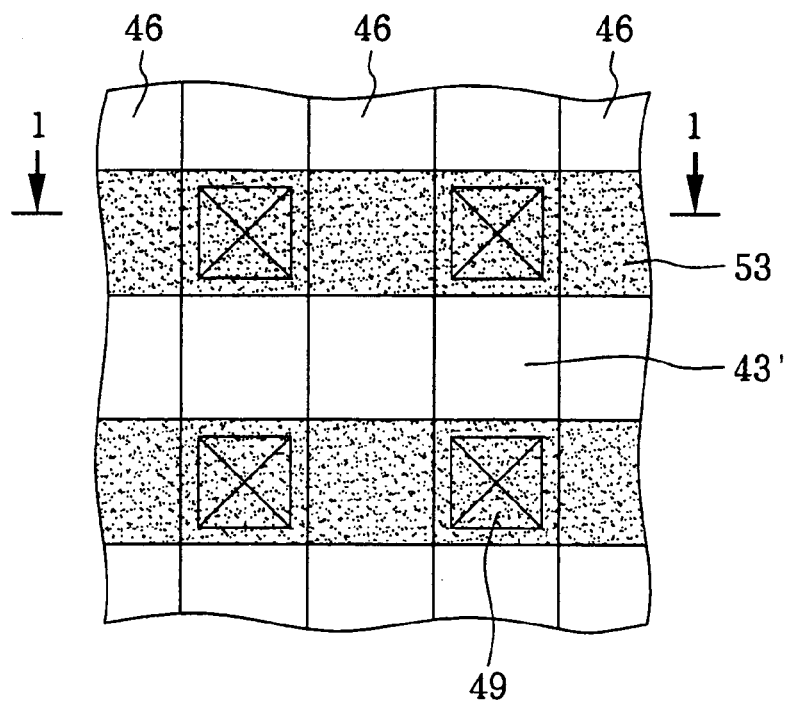
FIGS. 34 and 35 illustrate a method to form isolations between vertical memory cells in accordance with the present invention.
Figure 35:
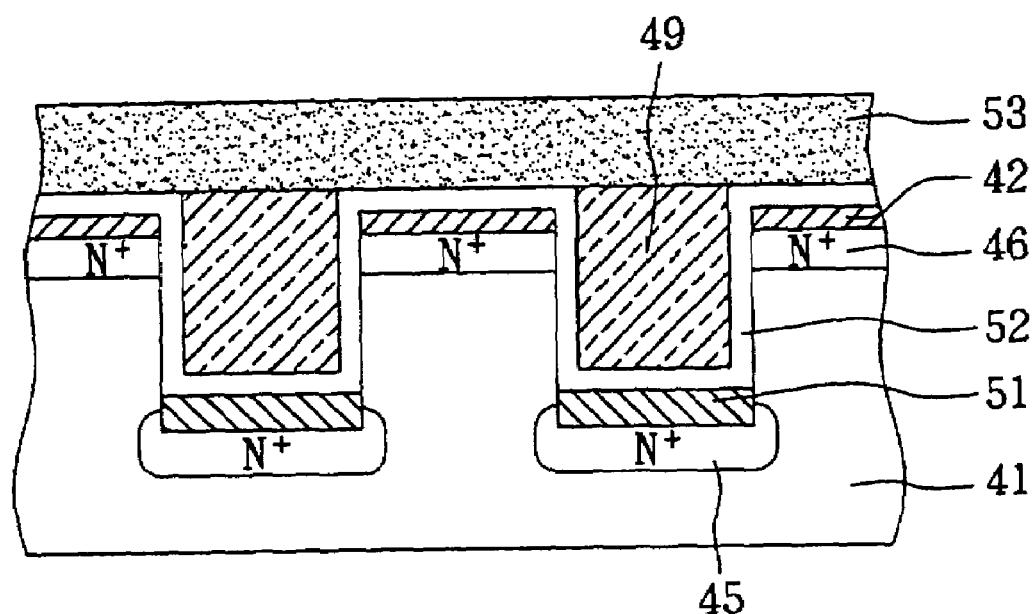

Moreover, this process can also be implemented to form vertical memory cells of SONOS type. Referring to FIGS. 34 and 35, wherein FIG. 35 is the cross-sectional view along line 1–1 in FIG. 34, the sequential process after the holes 48 formation is essentially equivalent to that shown in FIGS. 7 through 11, and a planarization process is substituted for the etching back process performed in FIG. 12 followed by forming the conductive word lines as described in FIGS. 15 and 16, thereby an insulating layer 51 is formed on the first doping regions 45, an ONO layer 52 is formed along the trenches 44, conductive plugs 49 are formed in the trenches 44, and conductive lines 53 perpendicular to the second doping regions 46 are formed thereon. Consequently, vertical memory cells of SONOS type are formed.

Accordingly, the non-volatile memory array made in accordance with the present invention can be well operated whereby a high degree integration of memory can be attained.

Besides the manufacturing method regarding NMOS type transistor mentioned above, the PMOS type transistor can also be implemented by doping boron ions without departing from the spirit of the present invention.

The above-described embodiments of the present invention are intended to be illustrative only. Numerous alternative embodiments may be devised by those skilled in the art without departing from the scope of the following claims.

What is claimed is:

1. A method for manufacturing a vertical split gate memory cell, comprising the steps of:
   providing a semiconductor substrate;
   forming at least one trench in the semiconductor substrate;
   implanting dopants into the semiconductor substrate to form a first doping region and a second doping region at different heights, wherein the first doping region is underneath the bottom of the trench, and the second doping region is beside the top of the trench; forming a gate dielectric layer along the trench;
   forming a conductive line serving as a select gate of the vertical split gate memory cell and being filled up to a predetermined height in the bottom of the trench;
   forming an insulating layer on the conductive line; and
   forming a conductive plug on the insulating layer and being filled up to the top of the trench, wherein the conductive plug serves as a control gate of the vertical split gate memory cell.

2. The method for manufacturing a vertical split gate memory cell of claim 1, wherein the gate dielectric layer is an oxide-nitride-oxide layer.

3. The method for manufacturing a vertical split gate memory cell of claim 1, wherein the gate dielectric layer comprises an oxide-nitride-oxide layer and a silicon oxide layer.

4. The method for manufacturing a vertical split gate memory cell of claim 1, further comprising a tilted implantation step for threshold voltage adjustment.

5. The method for manufacturing a vertical split gate memory cell of claim 1, wherein the first and second doping regions are implanted after the formation of the trench.

6. The method for manufacturing a vertical split gate memory cell of claim 1, wherein the second doping region is implanted before the trench is formed, and the first doping region is implanted after the trench is formed.

7. The method for manufacturing a vertical split gate memory cell of claim 1, wherein the first and second doping regions are implanted before the formation of the trench.

8. The method for manufacturing a vertical split gate memory cell of claim 7, wherein the first doping region acts as a common bit line.

* * * * *